(12) United States Patent
Yu

(10) Patent No.: US 6,431,900 B1
(45) Date of Patent: Aug. 13, 2002

(54) ZERO INSERTION FORCE CONNECTOR

(75) Inventor: Hung-Chi Yu, Hsi-Chih (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/877,552

(22) Filed: Jun. 8, 2001

(51) Int. Cl.$^7$ .......................................... H01R 13/625
(52) U.S. Cl. ..................................................... 439/342
(58) Field of Search .......................... 439/342, 259–270

(56) References Cited

U.S. PATENT DOCUMENTS

| | | | |
|---|---|---|---|
| 6,116,936 A * | 9/2000 | Pei | 439/342 |
| 6,171,156 B1 * | 1/2001 | Lin et al. | 439/342 |
| 6,200,154 B1 * | 3/2001 | Yu | 439/342 |
| 6,203,350 B1 * | 3/2001 | Walkup et al. | 439/342 |
| 6,213,807 B1 * | 4/2001 | Huang et al. | 439/342 |
| 6,231,366 B1 * | 5/2001 | Pei et al. | 439/342 |
| 6,247,953 B1 * | 6/2001 | Walkup et al. | 439/342 |
| 6,250,941 B1 * | 6/2001 | Huang et al. | 439/342 |
| 6,254,415 B1 * | 7/2001 | Mizumura et al. | 439/342 |
| 6,280,224 B1 * | 8/2001 | Huang | 439/342 |

* cited by examiner

*Primary Examiner*—Gary F. Paumen
(74) *Attorney, Agent, or Firm*—Wei Te Chung

(57) ABSTRACT

A ZIF connector connecting a chip (5) to a printed circuit board includes a base (2) defining a plurality of channels (25) and an opening (24), a cover (1) slidable on the base having a plurality of through holes (14) corresponding to the channels and a cavity (120), a plurality of contacts (4) received in the channels, and a cam mechanism (3) including a handle (30), a driving portion (31) extending from an end of the handle with a stopper (310) formed thereon, and a shaft (32) connecting to the driving portion. The driving portion and the shaft are respectively rotatable in the cavity of the cover and the opening of the base. The handle of the cam mechanism provides a user with a convenient operation to drive the cover moving on the base from an open position to a closed position.

1 Claim, 7 Drawing Sheets

ZERO INSERTION FORCE CONNECTOR

BACKGROUND OF THE INVENTION

1. Field of the Invention

The present invention relates to a zero insertion force (ZIF) connector, and particularly to a zero insertion force connector having a mechanism with a handle thereon for conveniently driving a cover sliding on a base.

2. Description of Related Art

Taiwan Patent Application No. 85107705 discloses a conventional ZIF connector including an insulating base, a cover, a plurality of contacts received in the insulating base, and a cam. The cam comprises a lower column and an upper column stacked together with individual axes thereof being offset from each other a predetermined distance. When the cam rotates, the cover is driven to slide on the base, whereby tail portions of pins of an electronic component mounted on the cover electrically engage with and disengage from the contacts of the connector. Therefore, an electrical circuit between the connector and the electronic component is attained or broken. However, an external tool is needed to rotate the cam, which results an inconvenient operation for a user.

Hence, an improved ZIF connector is required to overcome the above-mentioned disadvantages of the prior art.

SUMMARY OF THE INVENTION

Accordingly, the object of the present invention is to provide a ZIF connector having an improved cam mechanism thereon for being convenient for a user to drive a cover on a base.

In order to achieve the object set forth, a ZIF connector connecting a chip to a printed circuit board comprises a cover, an insulating base having a plurality of contacts received therein, and a cam mechanism accommodated in the cover and the base. The cam mechanism has a handle, a driving portion extending downwardly from an end of the handle, and a rotating shaft extending from a bottom side of the driving portion. The driving portion and the shaft are all configured as columns. The diameter of the driving portion is larger than that of the shaft and the axes of them offset from each other a predetermined distance. Respectively, the driving portion and the shaft engage with and are movable in a cavity defined in the cover and an elliptic opening defined in the base. When a user rotates the handle, the driving portion is swiveled in the cavity and drives the cover to slide on the base for the shaft could not move along a minimum width of the opening. The handle is convenient for the user in inserting/taking out the chip and an easy operation is therefore achieved.

Other objects, advantages and novel features of the invention will become more apparent from the following detailed description when taken in conjunction with the accompanying drawings.

DETAILED DESCRIPTION OF THE INVENTION

Figure 1:
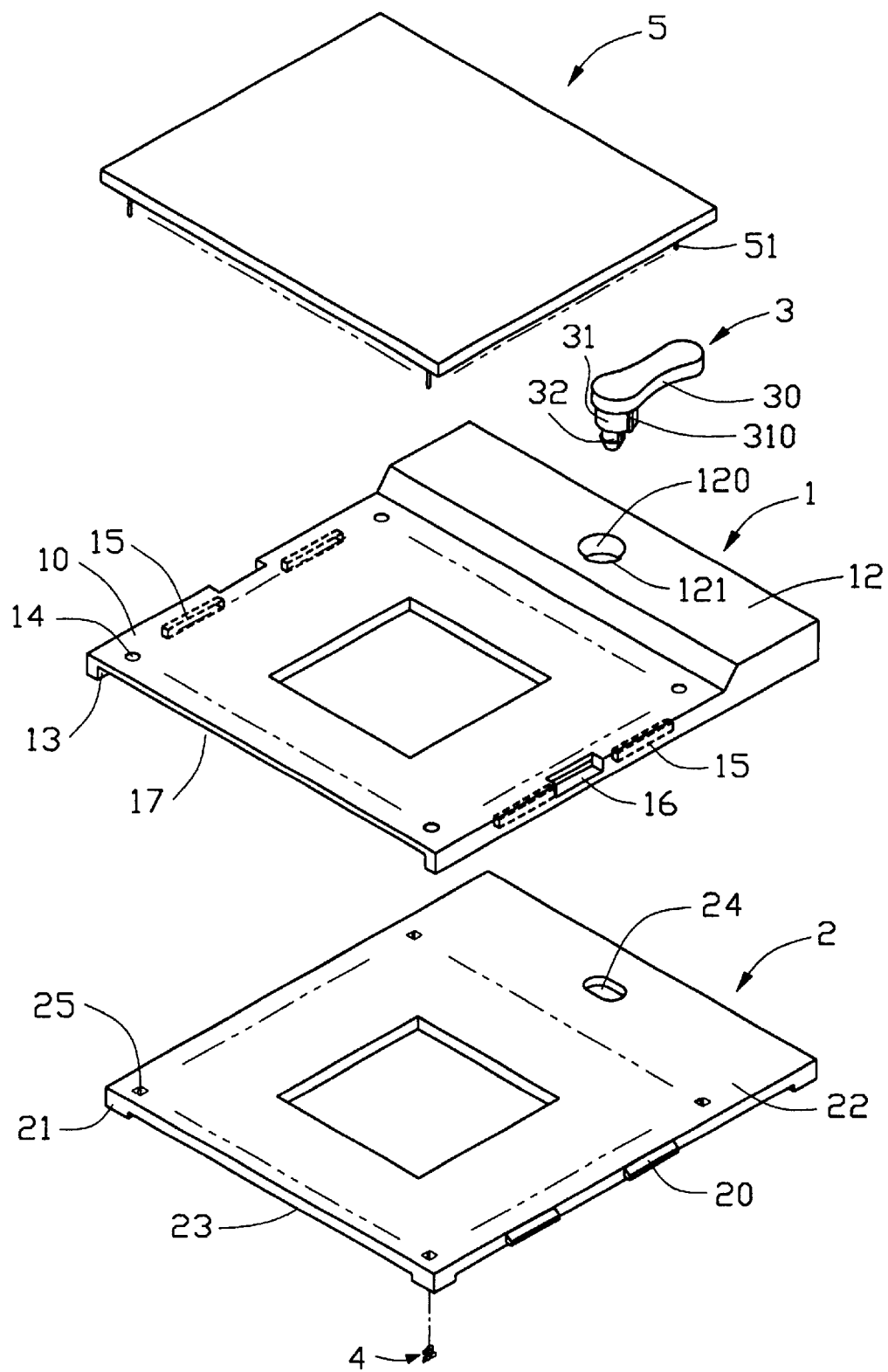
FIG. 1 is an exploded view showing a ZIF connector in accordance with the present invention engaging with a chip.

Reference will now be made to the drawing figures to describe the present invention in detail.

Figure 2:
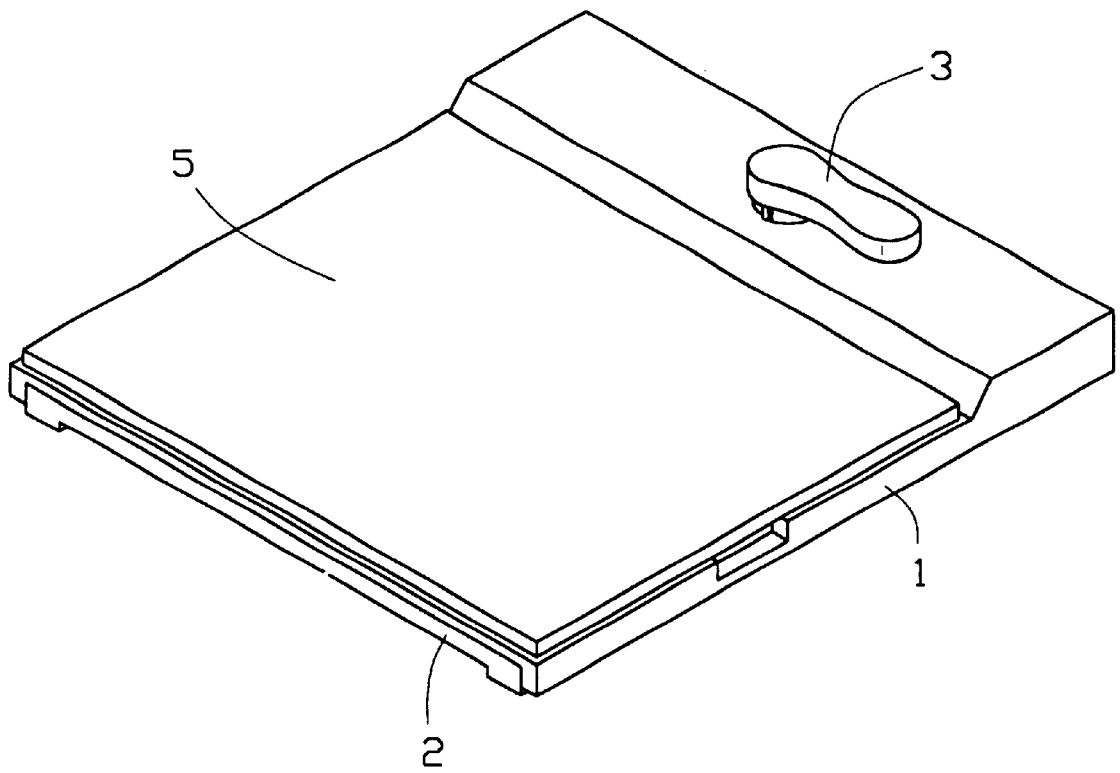
FIG. 2 is an assembled view of FIG. 1.

Referring to FIGS. 1–2, a ZIF connector in accordance with the present invention is adapted for electrically connecting a chip 5 to a printed circuit board (not shown). The ZIF connector comprises an insulating base 2 having a plurality of contacts 4 received therein, a cover 1 movable on the base 2, and a cam mechanism 3 attached thereon.

The insulating base 2 is configured as a rectangular shape and defines an elliptic opening 24 at an end thereof passing through a top face 22 and a bottom face 23 of the base 2. A pair of projections 20 extends from each opposite side edge of the insulating base 2 and four standoffs 21 are formed at opposite corners of the bottom face 23 for supporting and blocking up the base 2. The insulating base 2 defines a plurality of channels 25 thereof for receiving the corresponding contacts 4 therein.

The cover 1 movable on the insulating base 2 comprises a main body 10 and a head section 12 extending from one end edge of the main body 10. The head section 12 defines a receiving cavity 120 in a middle thereof for receiving corresponding part of the cam mechanism 3. A groove 121 spanning an arc of approximately 90 degrees is defined on the head section 12 and communicates with the receiving cavity 120. A pair of side walls 13 extends downwardly from opposite side edge of the main body 10 and a space 17 is defined therebetween for receiving the insulating base 2. Each side wall 13 defines a pair of sliding slots 15 in an inner side thereof for engaging with the projections 20 of the insulating base 2. A pair of recesses 16 are respectively defined on outside of each side wall 13. The cover 1 also defines a plurality of through holes 14 thereon for communicating with the channels 25 of the base 2.

Figure 3:
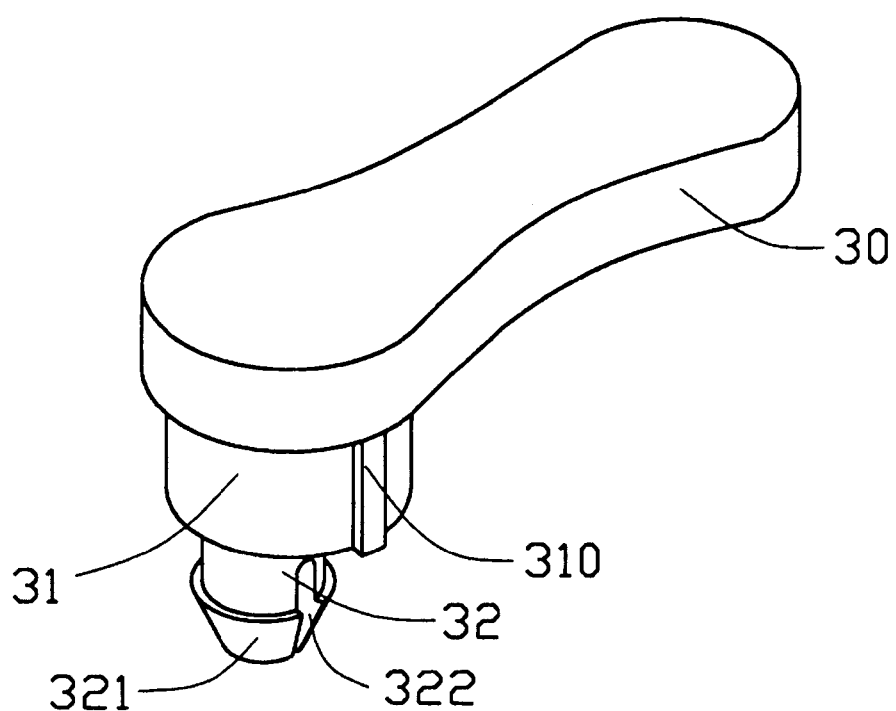
FIG. 3 is a partial, exploded view of a cam mechanism for moving a cover on a base.
Figure 3:
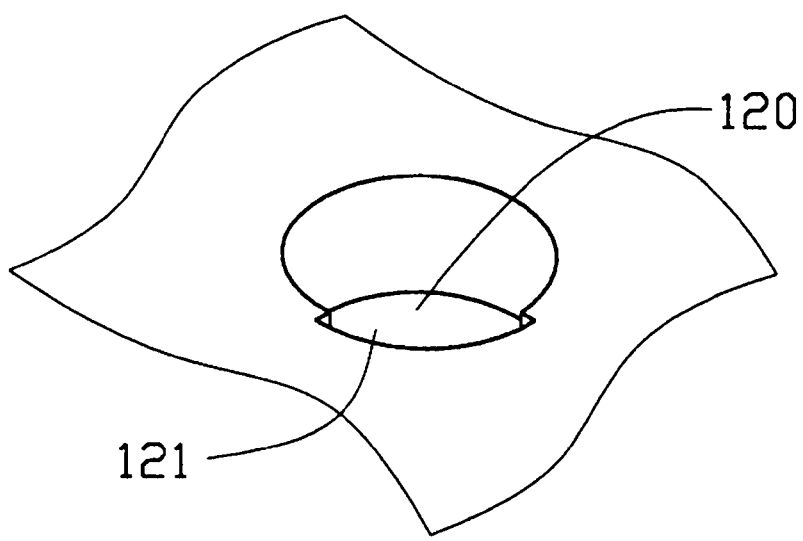
Figure 4:
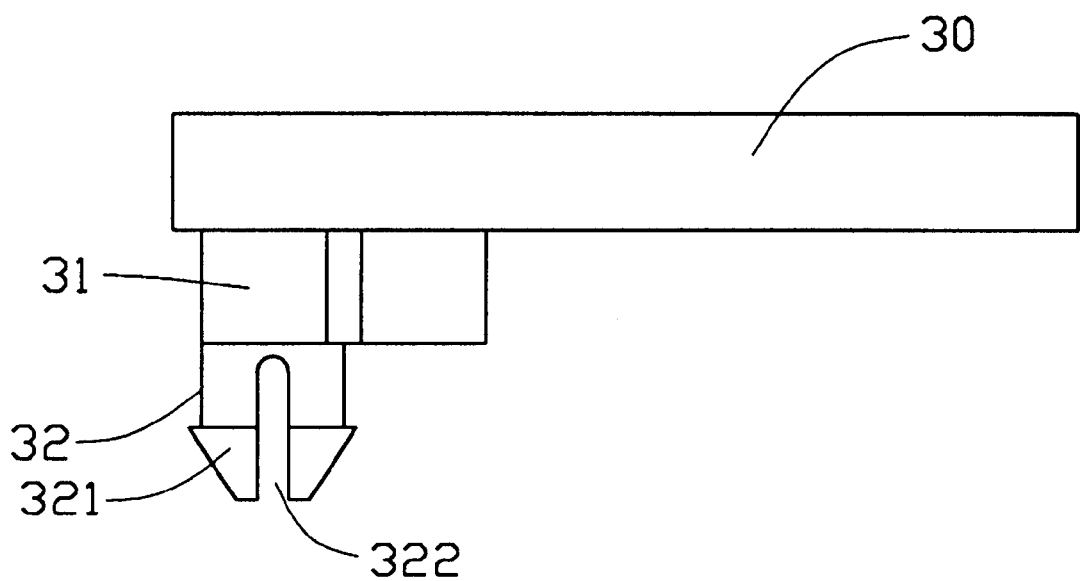
FIG. 4 is a side view of the cam mechanism.

Referring to FIGS. 3–4, the cam mechanism 3 comprises a handle 30, a driving portion 31 extending from an end of the handle 30, and a rotating shaft 32 extending from a bottom side of the driving portion 31. The driving portion 31 and the rotating shaft 32 are configured as columns. The diameter of the rotating shaft 32 is smaller than that of the driving portion 31 and the axes of them offset from each other a predetermined distance. The driving portion 31 and the rotating shaft 32 are respectively received and movable in the receiving cavity 120 of the cover 1 and the opening 24 of the insulating base 2. One end of the rotating shaft 32 is shaped as a boardlock 321 with a slot 322 being defined in a center thereof to protect the cam mechanism 3 from deviating from the ZIF connector. A stopper 310 is defined on a periphery of the driving portion 31 and received correspondingly in the groove 121 of the receiving cavity 120.

Figure 5:
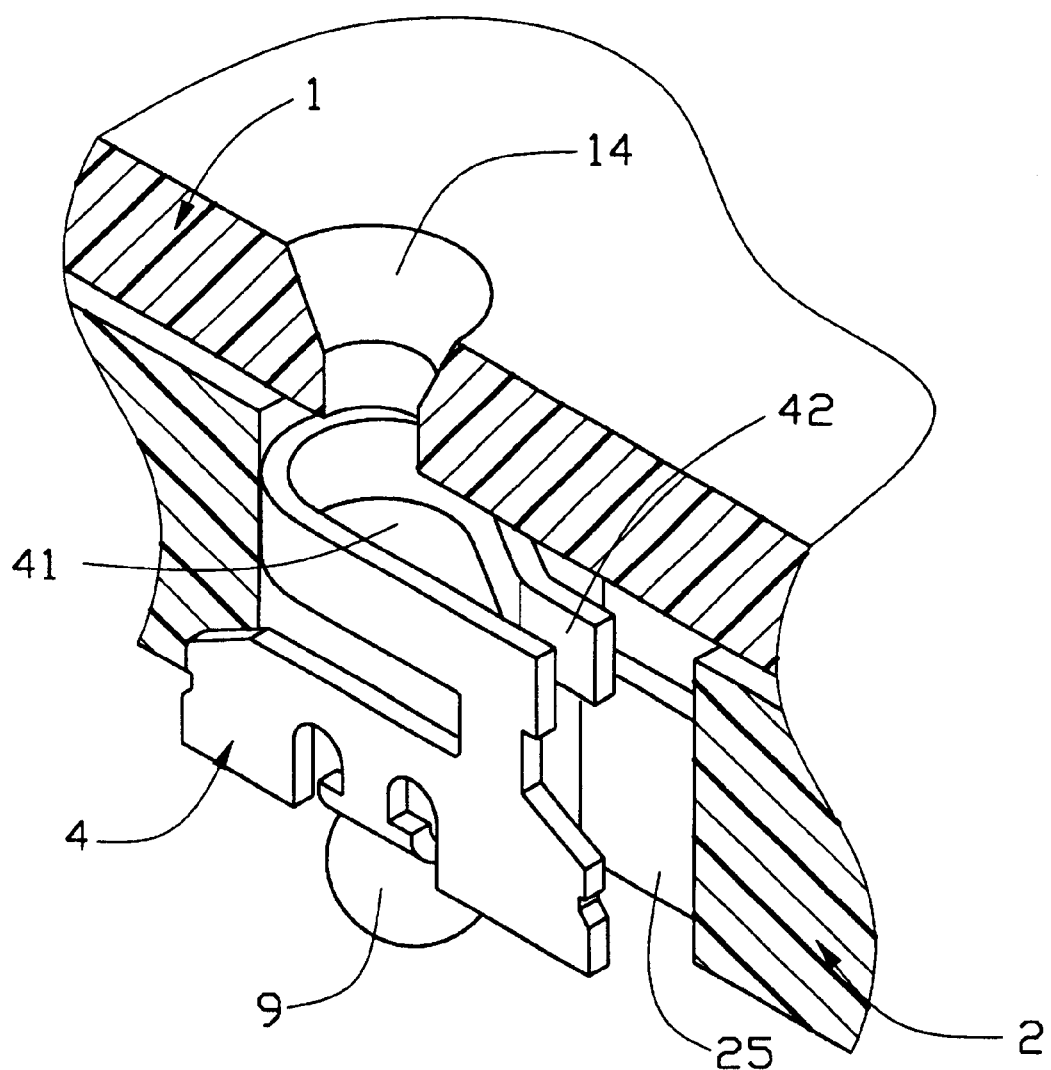
FIG. 5 is a partial, cutaway view of the ZIF connector illustrating a contact at a disengaged state.
Figure 6:
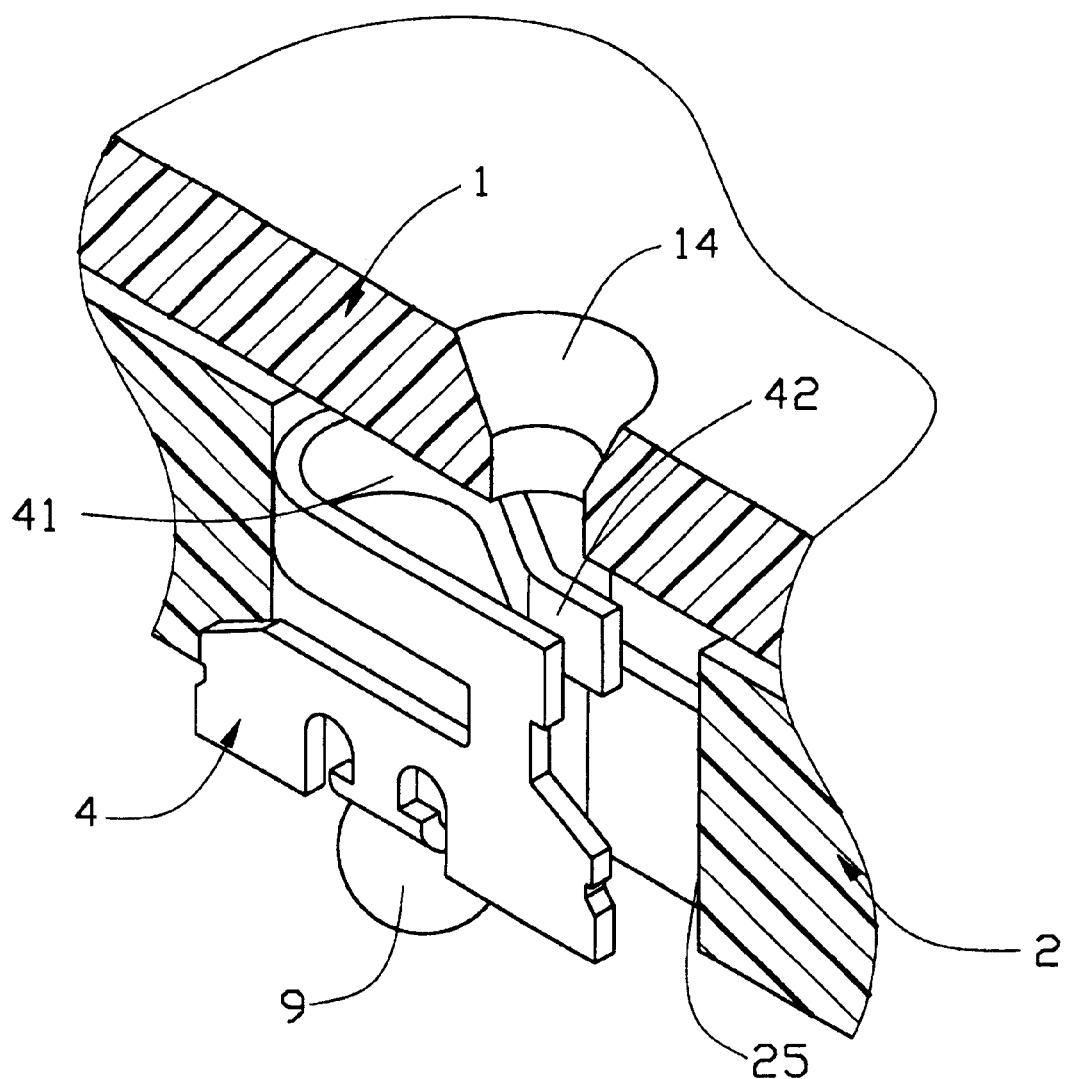
FIG. 6 is a partial, cutaway view of the ZIF connector illustrating the contact at an engaged state.

Referring to FIGS. 5–6, each contact 4 defines a first receiving portion 41 and a second receiving portion 42 in a top thereof for electrically connecting with pins 51 of the chip 5. A space defined by the first receiving portion 41 is wider than a space defined by the second receiving portion 42. A solder ball 9 is formed in a bottom of the contact 4 for connecting the contacts 4 to the printed circuit board.

In assembly, referring to the FIG. 1, the cover 1 is assembled on the insulating base 2, whereby the projections 20 are received in the corresponding slots 15 and slide therein. The through holes 14 of the cover 1 are arrayed with the channels 25 of the insulating base 2 and the receiving cavity 120 is lined up with the opening 24. The cam mechanism 3 is attached to the cover 1 and the base 2 with the driving portion 31 being received in the receiving cavity 120 and the stopper 310 of the driving portion 31 engaging with and moving in the groove 121 of the cover 1. The rotating shaft 32 of the cam mechanism 3 is contained in the elliptic opening 24 with the boardlock 321 thereof passing through the opening 24 and abutting against the bottom face 23 of the base 2. The handle 30 of the cam mechanism 3 is parallel to a top surface of the cover 1.

Figure 7:
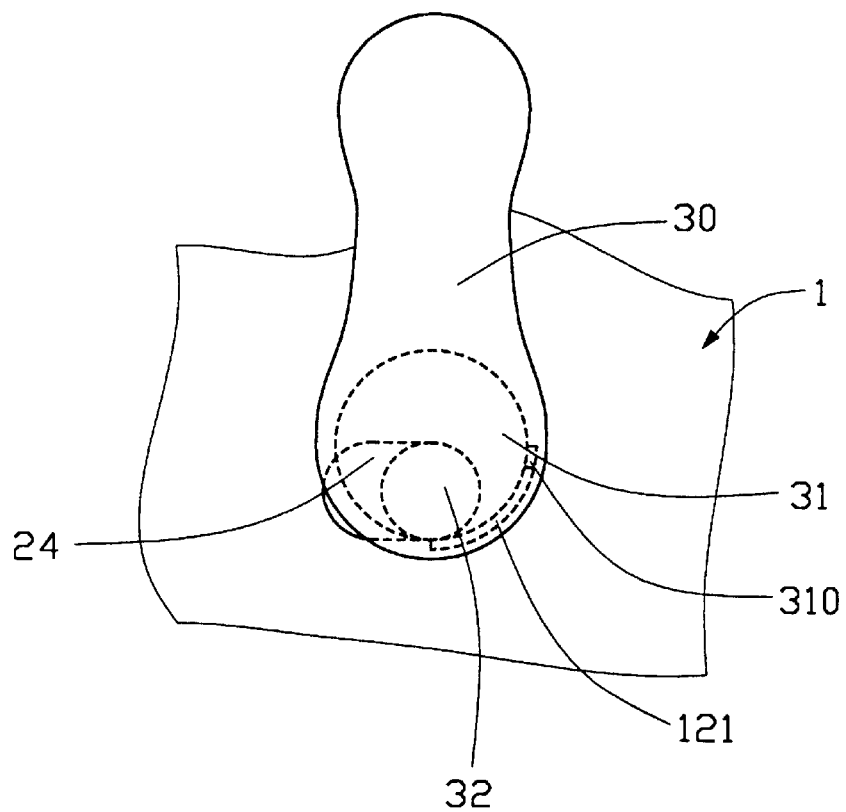
FIG. 7 is a partial, top view of the cam mechanism of the ZIF connector being at an open position.
Figure 8:
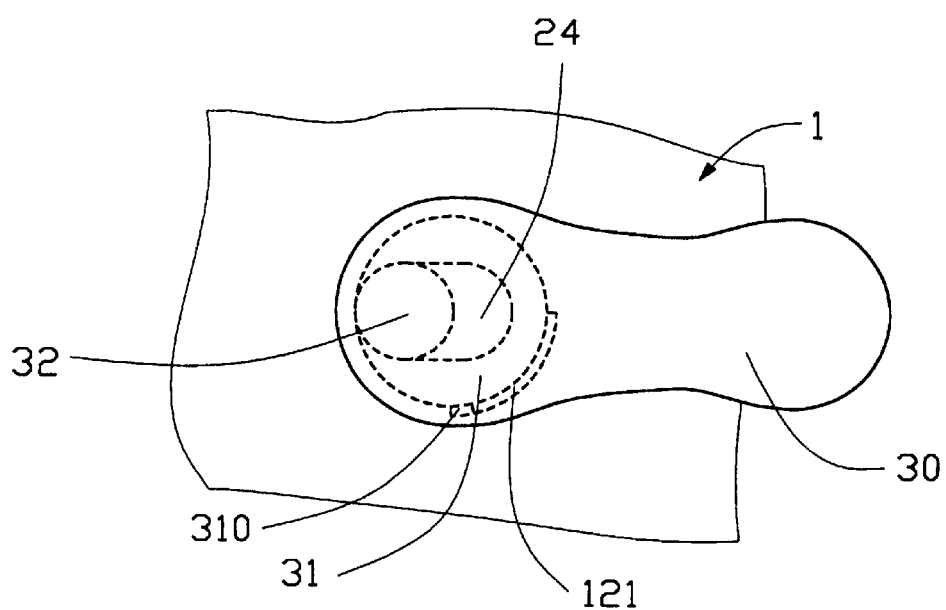
FIG. 8 is a view similar to FIG. 7 but illustrating the cam mechanism of the ZIF connector being at a closed position.

Referring to FIG. 5, which shows the contact 4 at a disengaged state, when the connector is in an open position, the through holes 14 of the cover 1 are aligned with the first receiving portions 41 of the contacts 4, whereby the pins 51 of the chip 5 are inserted into the space of the first receiving portions 41 without imparting insertion force. At the same time, referring to FIG. 7, the handle 30 of the cam mechanism 3 is vertical to a ribbon width of the elliptic opening 24 and the rotating shaft 32 is located at an end of the opening 24. The stopper 310 of the driving portion 31 is positioned in a side of the groove 121. In operation, when a user operates the handle 30 to rotate along a clockwise direction at approximately an angle of 90 degrees, the driving portion 31 and the rotating shaft 32 are swiveled in the corresponding cavity 120 and the opening 24. The shaft 32 is limited to move along a minimum width of the opening 24, whereby the driving portion 31 exerts a force on a periphery of the cavity 120 to drive the cover 1 sliding on the base 1 and cause the stopper 310 thereof moving in the groove 121 from one side to the other side. Referring to FIG. 8, the handle 30 is parallel to the ribbon width of the opening 24 and the shaft 32 moves in the opening 24 to the other end thereof. Therefore, referring to FIG. 6 which shows the contact 4 at an engaged state, the connector is in a closed position. The through holes 14 are aligned with the second receiving portions 42 of the contacts 4 and the pins 51 of the chip 5 are electrically engaging with the second receiving portions 42. During operation, the engagement between the stopper 310 of the driving portion 31 and the groove 121 of the cover 1 can limit the cover 1 sliding on the base 2 from the open position to the closed position.

The handle 30 of the cam mechanism 3 is convenient for the user during inserting or taking out the chip 5. Thus, an easy operation is achieved.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ZIF connector for connecting a chip with a plurality of pins to a printed circuit board comprising:

an insulating base defining a plurality of channels and an opening;

a cover being slidable on the base, the cover having a plurality of through holes corresponding to the channels of the base and defining a cavity thereon;

a plurality of contacts received in the channels of the base; and a cam mechanism comprising a handle, a driving portion extending from an end of the handle, and a rotating shaft extending form the driving portion, the driving portion and the shaft being moveable respectively in the cavity of the cover and the opening of the base;

wherein the driving portion and the shaft are configured as columns, the diameter of the driving portion being larger than that of the shaft, and axes of the driving portion and the shaft being offset from each other a predetermined distance;

wherein the cover has a top surface and the handle of the cam mechanism is parallel thereto;

wherein the opening of the base is formed in an elliptic shape, whereby when the connector is in an open position, the handle of the cam mechanism is parallel to a minimum width of the opening of the base, and when the connector is in a closed position, the handle of the cam mechanism is normal to the minimum width of the opening;

wherein the driving portion of the cam mechanism forms a stopper on a periphery thereof and the cover defines a groove thereon spanning an angle of approximately ninety degrees and communicating with the cavity, the stopper of the driving portion being movable received in the groove;

wherein each contact forms a first receiving portion and a second receiving portion in a top thereof, whereby when the connector is in the open position, the through holes are aligned with the first receiving portions of the contacts, and when the connector is in the closed position, the through holes are aligned with the second receiving portions of the contacts;

whereby when the connector is in the open position, the pins of the chip disengage from the first receiving portions of the contacts, and when the connector is in the closed position, the pins of the chip engage with the second receiving portions of the contacts;

wherein the shaft of the cam mechanism forms a boardlock at an end thereof for securing the cam mechanism to the ZIF connector.

* * * * *